(12) United States Patent
Zhang et al.

(10) Patent No.: US 12,731,758 B2
(45) Date of Patent: Sep. 8, 2026

(54) ION BEAM ETCHING MACHINE AND LOWER ELECTRODE STRUCTURE THEREOF

(71) Applicant: JIANGSU LEUVEN INSTRUMENTS CO., LTD., Xuzhou (CN)

(72) Inventors: Huaidong Zhang, Xuzhou (CN); Yaoyao Zhang, Xuzhou (CN); Dongdong Hu, Xuzhou (CN); Chaoquan Yang, Xuzhou (CN); Shiran Cheng, Xuzhou (CN); Xiang Yu, Xuzhou (CN); Xiaoli Shi, Xuzhou (CN); Kaidong Xu, Xuzhou (CN)

(73) Assignee: JIANGSU LEUVEN INSTRUMENTS CO., LTD., Xuzhou (CN)

( * ) Notice: Subject to any disclaimer, the term of this patent is extended or adjusted under 35 U.S.C. 154(b) by 393 days.

(21) Appl. No.: 18/681,776

(22) PCT Filed: Sep. 9, 2022

(86) PCT No.: PCT/CN2022/118026
§ 371 (c)(1),
(2) Date: Feb. 6, 2024

(87) PCT Pub. No.: WO2023/040758
PCT Pub. Date: Mar. 23, 2023

(65) Prior Publication Data

US 2025/0140512 A1 May 1, 2025

(30) Foreign Application Priority Data

Sep. 15, 2021 (CN) ......................... 202111081752.1

(51) Int. Cl.
*H01J 37/20* (2006.01)
*H01J 37/244* (2006.01)
*H01J 37/305* (2006.01)

(52) U.S. Cl.
CPC ............ *H01J 37/20* (2013.01); *H01J 37/244* (2013.01); *H01J 37/3053* (2013.01); *H01J 2237/20235* (2013.01); *H01J 2237/24578* (2013.01)

(58) Field of Classification Search
CPC .. H01J 37/00; H01J 37/02; H01J 37/20; H01J 37/26; H01J 37/28; H01J 37/244;
(Continued)

(56) References Cited

U.S. PATENT DOCUMENTS 5,262,029 A * 11/1993 Erskine ............... H10P 72/7606
118/503
6,547,559 B1 * 4/2003 Hodos ................ H10P 72/7606
269/21
(Continued)

FOREIGN PATENT DOCUMENTS

CN 103367215 A 10/2013
CN 105390430 A 3/2016
(Continued)

OTHER PUBLICATIONS

Chinese Office Action regarding Application No. 2021110817521, dated Aug. 20, 2024.
(Continued)

*Primary Examiner* — Jason L McCormack
(74) *Attorney, Agent, or Firm* — Harness, Dickey & Pierce, P.L.C.

(57) ABSTRACT

An ion beam etching machine and a lower electrode structure thereof. The lower electrode structure comprises an electrode plate, a ring pressing mechanism, and a lifting mechanism, the ring pressing mechanism being configured to support a member to be etched, and the lifting mechanism being configured to drive the ring pressing mechanism to ascend and descend relative to the electrode plate; and same
(Continued)

further comprises a position measurement mechanism for measuring a position to which the ring pressing mechanism descends relative to the electrode plate. The lifting mechanism is configured to stop driving the ring pressing mechanism to descend based on measurement information fed back by the position measurement mechanism. The arrangement of the lower electrode structure can avoid fragmenting of the member to be etched, and improve the product yield.

12 Claims, 7 Drawing Sheets

(58) Field of Classification Search
CPC ................. H01J 37/3053; H01J 37/305; H01J 37/32715; H01J 37/32; H01J 37/32568; H01J 2237/20235; H01J 2237/24578; H10P 72/7606; H10P 72/7612; Y02P 70/50
USPC ........................................................ 250/492.3
See application file for complete search history.

(56) References Cited

U.S. PATENT DOCUMENTS

| | | | | |
|---|---|---|---|---|
| 2014/0130743 | A1* | 5/2014 | Toriya | C23C 16/45544 118/725 |
| 2018/0330926 | A1 | 11/2018 | Boyd, Jr. et al. | |
| 2019/0371635 | A1* | 12/2019 | Oori | H01J 37/32642 |

FOREIGN PATENT DOCUMENTS

| | | | |
|---|---|---|---|
| CN | 105609459 | A | 5/2016 |
| CN | 107611054 | A | 1/2018 |
| JP | 2000077392 | A | 3/2000 |
| KR | 19990025115 | U | 7/1999 |
| KR | 20080092766 | A | 10/2008 |
| KR | 20190130971 | A | 11/2019 |

OTHER PUBLICATIONS

Korean First Office Action regarding Application No. 10-2024-7004459, dated Jun. 27, 2025, with English translation.

International Search Report of the ISA issued in PCT/CN2022/118026, mailed Dec. 1, 2022; ISA/CN.

* cited by examiner

ION BEAM ETCHING MACHINE AND LOWER ELECTRODE STRUCTURE THEREOF

CROSS REFERENCE OF RELATED APPLICATION

This application is the national phase of International Application No. PCT/CN2022/118026, titled "ION BEAM ETCHING MACHINE AND LOWER ELECTRODE STRUCTURE THEREOF", filed on Sep. 9, 2022, which claims priority to Chinese Patent Application No. 202111081752.1, titled "ION BEAM ETCHING MACHINE AND LOWER ELECTRODE STRUCTURE THEREOF", filed on Sep. 15, 2021 with the China National Intellectual Property Administration, both of which are incorporated herein by reference in their entireties.

FIELD

The present disclosure relates to the field of etching machine, and in particular to an ion beam etching machine and lower electrode structure thereof.

BACKGROUND

In ion beam etching, the principle of glow discharge is used to decompose an argon gas into argon ions, and the argon ions are accelerated by an anode electric field to physically bombard a surface of a sample to achieve an etching effect.

A lower electrode structure of an ion beam etching machine includes an electrode plate and a supporting component. The supporting component, driven by a lifting mechanism, may be raised or descended relative to the electrode plate to place a to-be-etched component, such as a wafer, on the electrode plate and press the to-be-etched component tightly. During operation, the lifting mechanism first drives the supporting component to rise relative to the electrode plate to facilitate receiving the to-be-etched component transferred. Then the lifting mechanism drives the supporting component, where the to-be-etched component is placed, to descend to place and press tightly the to-be-etched component on the electrode plate.

During operation of the lower electrode structure of a conventional ion beam etching machine, when the to-be-etched component is placed and pressed tightly on the electrode plate, the to-be-etched component is prone to being crushed.

SUMMARY

An ion beam etching machine and a lower electrode structure thereof are provided according to the present disclosure. The arrangement of the lower electrode structure can prevent the to-be-etched component from being crushed and improve product yield.

In order to solve the above technical problems, a lower electrode structure of an ion beam etching machine is provided according to embodiments of the present disclosure. The lower electrode structure includes an electrode plate, a pressing ring mechanism and a lifting mechanism. The pressing ring mechanism is configured to support a to-be-etched component. The lifting mechanism is configured for driving the pressing ring mechanism to rise and descend relative to the electrode plate. The lower electrode structure further includes a position detection mechanism, the position detection mechanism is configured to detect a position to which the pressing ring mechanism descends relative to the electrode plate, and the lifting mechanism is configured to stop driving the pressing ring mechanism to descend based on detection information fed back by the position detection mechanism.

The lower electrode structure of the ion beam etching machine is provided with the position detection mechanism for detecting the position to which the pressing ring mechanism descends relative to the electrode plate. The lifting mechanism can stop driving the pressing ring mechanism to descend based on the detection information fed back by the position detection mechanism. In practical application, a setting position, where the to-be-etched component is placed on the electrode plate and the pressing ring mechanism may fit the electrode plate to press the to-be-etched component, may be determined based on a relative position arrangement of the pressing ring mechanism and the electrode plate. The position detection mechanism may detect whether the pressing ring mechanism descends to the setting position. In a case that the pressing ring mechanism descends to the setting position, the position detection mechanism may feedback the corresponding information. The lifting mechanism stops driving based on the feedback information to prevent the pressing ring mechanism from continuing to descend and crushing the to-be-etched component. Hence, the position, to which the pressing ring mechanism driven by the lifting mechanism to descend, may be accurately detected to prevent the to-be-etched component from being crushed, which may improve the product yield and save costs.

In one embodiment, the position detection mechanism includes an elastic member and a sensor. The elastic member may be compressed and deformed in a lifting direction of the pressing ring mechanism. The elastic member is disposed below the pressing ring mechanism. The pressing ring mechanism may press the elastic member during descending relative to the electrode plate. The sensor is configured to detect a deformation amount of the elastic member.

In one embodiment, the position detection mechanism includes a driving part, and the driving part is configured to drive the elastic member to rise and descend relative to the electrode plate to adjust an initial relative position between the elastic member and the electrode plate.

In one embodiment, the driving part includes a cylinder. The cylinder includes a telescopic end connected to a mounting base, and the elastic member and the sensor are both mounted on the mounting base.

In one embodiment, the elastic member is a bellows, and/or, the sensor is a fiber optic sensor.

In one embodiment, the pressing ring mechanism includes a pressure ring, a weight plate and a push rod. The pressure ring and the weight plate are connected by the push rod. The push rod is configured to pass through the electrode plate. The pressure ring is disposed above the electrode plate. The weight plate is disposed below the electrode plate. The pressure ring is provided with a supporting structure for supporting the to-be-etched component.

In one embodiment, the supporting structure includes a support ring. The support ring is fixed to a side of the pressure ring facing the electrode plate. The support ring includes a supporting surface facing the pressure ring, and the supporting surface is configured to support the to-be-etched component.

In one embodiment, the electrode plate is provided with a groove corresponding to the support ring, and the support ring may be embedded in the groove.

In one embodiment, the lower electrode structure includes a guide mechanism, and the guide mechanism is configured to guide the pressing ring mechanism to rise and descend.

In one embodiment, the guide mechanism includes a fixed base and a guide shaft. The guide shaft is configured to pass through the weight plate and is fixedly connected to the fixed base. The fixed base is fixedly connected to the electrode plate, and an axial direction of the guide shaft is parallel to a lifting direction of the pressing ring mechanism.

In one embodiment, the guide mechanism further includes a plunger base and a plunger. The guide shaft is configured to pass through the plunger base disposed below the weight plate, and the plunger is movable relative to the plunger base in order to apply a force to the guide shaft in a radial direction of the guide shaft.

An ion beam etching machine is further provided according to an embodiment of the present disclosure. The ion beam etching machine includes a vacuum chamber and a lower electrode structure disposed in the vacuum chamber. The lower electrode structure is the lower electrode structure described in any one of the above embodiments.

Since the above lower electrode structure has the above-mentioned technical effects, the ion etching machine including the lower electrode structure also has the same technical effects, which will not be discussed again here.

REFERENCE NUMERALS

Figure 1:
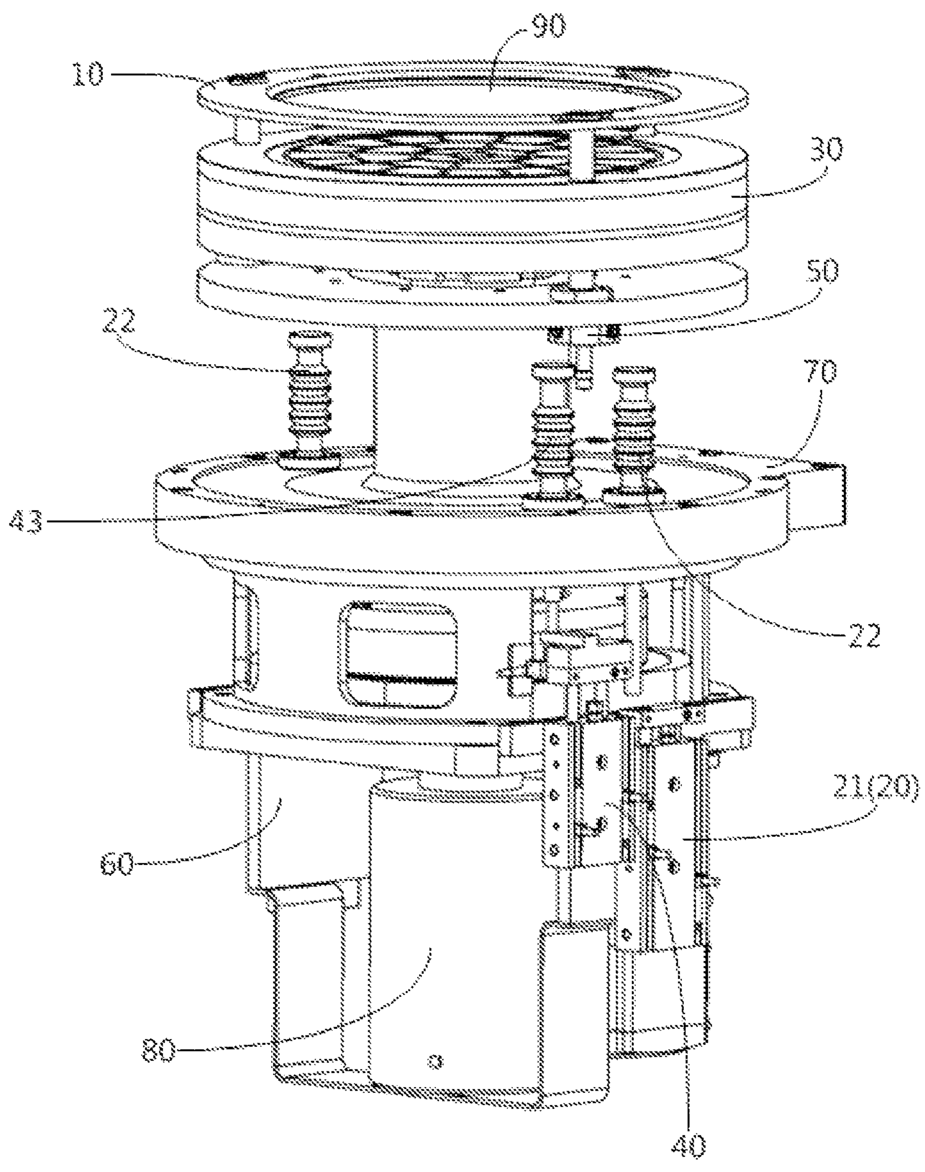
FIG. 1 is a schematic structural diagram of a lower electrode structure of an ion beam etching machine according to an embodiment of the present disclosure.

10: pressing ring mechanism
11: pressure plate
12: weight plate
13: push rod
14: support ring
20: lifting mechanism
21: lifting driving source
22: first bellows
30: electrode plate
40: position detection mechanism
41: driving part
42: mounting base
43: second bellows
44: sensor
50: guide mechanism
51: fixed base
52: guide shaft
53: plunger base
54: plunger
60: support frame -continued 70: partition
80: rotating mechanism
90: wafer

DETAILED DESCRIPTION OF EMBODIMENTS

The present disclosure is further described in detail below in conjunction with drawings and specific embodiments to enable those skilled in the art to better understand the solution of the present disclosure.

An ion beam etching machine and a lower electrode structure thereof are described below for ease of understanding and concise description. Beneficial effects will not be repeatedly discussed.

Directional words mentioned below, such as above, below, top or bottom, are defined relative to orientations or positions of component in the drawings. They are only for convenience of description and understanding of the scheme and should not be understood as limiting the scope of protection.

Figure 2:
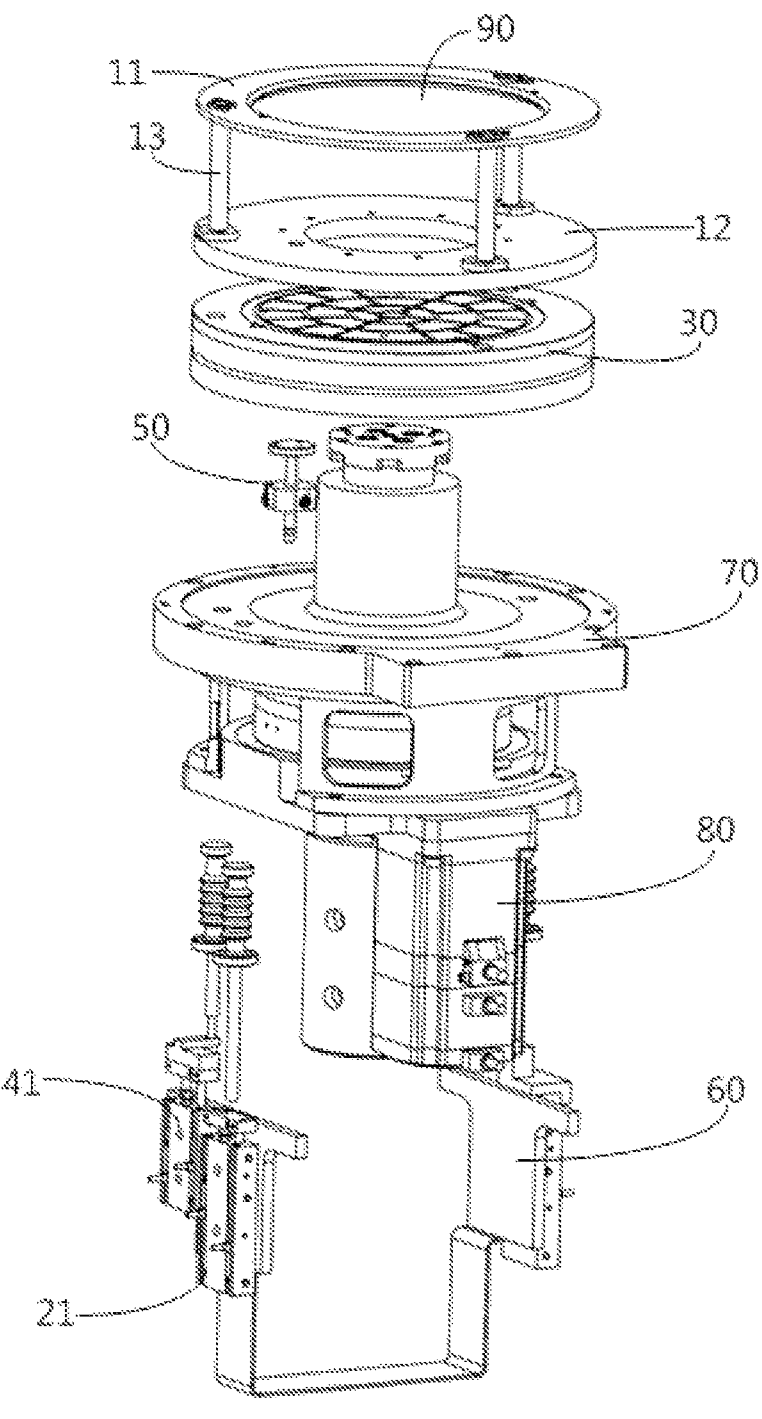
FIG. 2 is an exploded view of the lower electrode structure shown in FIG. 1.
Figure 3:
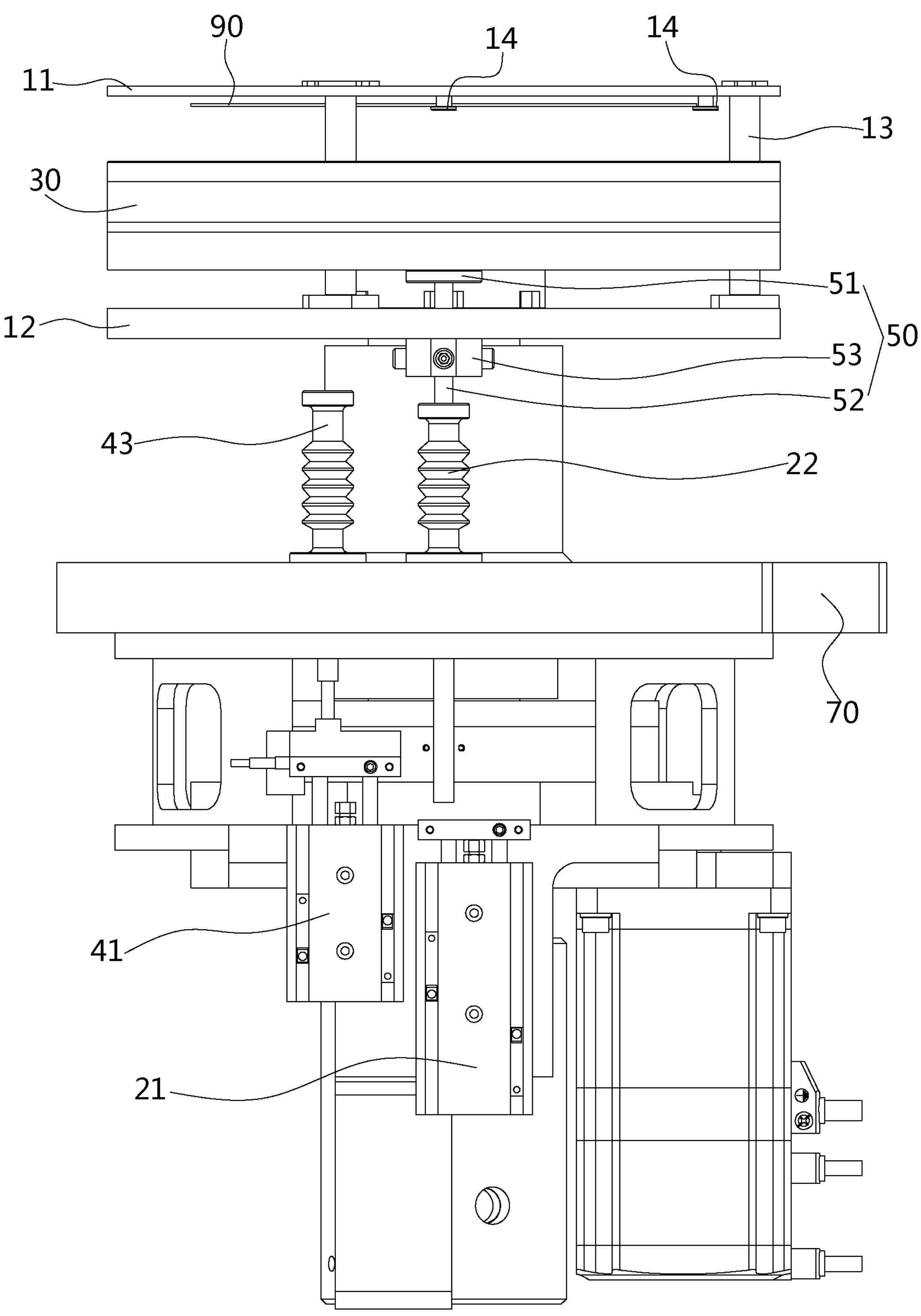
FIG. 3 is a front view of the lower electrode structure shown in FIG. 1.

References are made to FIGS. 1 to 3. FIG. 1 is a structural schematic diagram of a lower electrode structure of an ion beam etching machine according to an embodiment of the present disclosure. FIG. 2 is an exploded view of the lower electrode structure shown in FIG. 1. FIG. 3 is a front view of the lower electrode structure shown in FIG. 1.

The ion beam etching machine includes a vacuum chamber for etching and a lower electrode structure disposed in the vacuum chamber. The lower electrode structure is improved in the embodiment of the present disclosure. The lower electrode structure is explained in detail below.

In one embodiment, the lower electrode structure of the ion beam etching machine includes a pressing ring mechanism 10, a lifting mechanism 20 and an electrode plate 30. The pressing ring mechanism 10 is configured to support a to-be-etched component, such as a wafer 90. The lifting mechanism 20 is configured to drive the pressing ring mechanism 10 to rise and descend relative to the electrode plate 30, to place the to-be-etched component, such as the wafer 90, on the electrode plate 30 to facilitate subsequent etching operations. In following, the wafer 90 is configured to represent a to-be-etched component. In actual applications, the to-be-etched component may also be other component as needed.

During operation, the lifting mechanism 20 first drives the pressing ring mechanism 10 to rise relative to the electrode plate 30. That is, the pressing ring mechanism 10 moves upward in a direction away from the electrode plate 30. The wafer 90 transferred may be placed on the supporting structure of the pressing ring mechanism 10 by a robot or other equipment. Then the lifting mechanism 20 drives the pressing ring mechanism 10 to descend relative to the electrode plate 30 to place and press tightly the wafer 90 on the electrode plate 30.

In one embodiment, the lower electrode structure includes a partition 70, and the electrode plate 30 and the pressing ring mechanism 10 are disposed above the partition 70. The partition 70 is configured to separate a vacuum region and an atmosphere region in the main body of the lower electrode structure.

The electrode plate 30 is a platform on which the wafer 90 is placed during the etching process. During the etching process, the electrode plate 30 may rotate around its axis, driving the wafer 90 to rotate together to improve the uniformity of etching. The lower electrode structure further includes a rotating mechanism 80 for driving the electrode plate 30 to rotate.

The lifting mechanism 20 includes a lifting driving source 21 and a first bellows 22. The lifting driving source 21 may be a cylinder or a linear motor. The lifting driving source 21 is disposed below the partition 70. A movable end of the lifting driving source 21 is connected to the first bellows 22 to drive the first bellows 22 to rise and descend relative to the electrode plate 30. The first bellows 22 is disposed above the partition 70. An upper end of the first bellows 22 is connected to the pressing ring mechanism 10 through fasteners such as screws. Herein, the lifting driving source 21 drives the pressing ring mechanism 10 to rise and descend through the first bellows 22.

In actual, a number of the first bellows 22 may be two or more according to actual needs, to facilitate arrangement. Each first bellows 22 may be provided with a corresponding driving source such as a cylinder. These first bellows 22 need to move synchronously.

In other embodiments, the first bellows 22 may also be replaced by other components with elastic expansion and contraction functions.

In one embodiment, the lower electrode structure includes a position detection mechanism 40. The position detection mechanism 40 is configured to detect the position to which the pressing ring mechanism 10 descending relative to the electrode plate 30. The lifting mechanism 20 may also stop driving the pressing ring mechanism 10 to descend based on the detection information fed back by the position detection mechanism 40. In actual application, a setting position, where the wafer 90 is placed on the electrode plate 30 and the pressing ring mechanism 10 may fit the electrode plate 30 to press the wafer 90, may be determined based on a relative position arrangement of the pressing ring mechanism 10 and the electrode plate 30. The position detection mechanism 40 may detect whether the pressing ring mechanism 10 descends to the setting position. In a case that the pressing ring mechanism 10 descends to the setting position, the position detection mechanism 40 may feedback the corresponding information. The lifting mechanism 20 stops driving based on the feedback information to prevent the pressing ring mechanism 10 from continuing to descend and crushing the wafer 90. Hence, the position, to which the pressing ring mechanism 10 driven by the lifting mechanism 20 to descend, may be accurately detected to prevent the wafer 90 from being crushed, which may improve the product yield and save costs.

Figure 4:
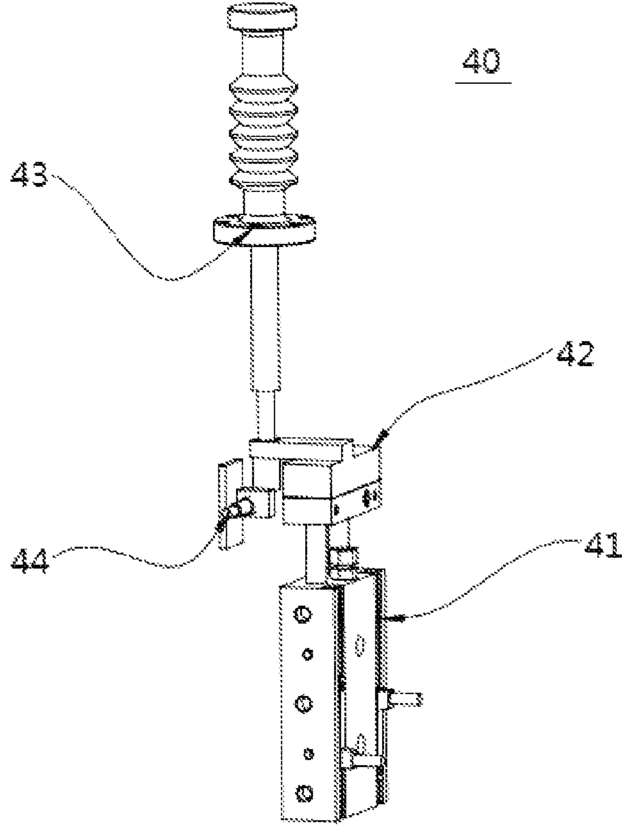
FIG. 4 is a schematic structural diagram of a position detection mechanism of the lower electrode structure in a specific embodiment.

Reference is made to FIG. 4, which is a schematic structural diagram of the position detection mechanism of the lower electrode structure in a specific embodiment.

The position detection mechanism 40 includes an elastic member and a sensor 44. The elastic member may be compressed and deformed in a lifting direction of the pressing ring mechanism 10. The elastic member is disposed below the pressing ring mechanism 10. The pressing ring mechanism 10 may press the elastic member in a case of descending relative to the electrode plate 30. The sensor 44 is configured to detect a deformation amount of the elastic member.

In one embodiment, for convenience of installation, the elastic member is in the form of a bellows. In order to distinguish said elastic member from the first bellows 22 of the aforementioned lifting mechanism 20, the elastic member here is called a second bellows 43. The second bellows 43 of the position detection mechanism 40 is also disposed above the partition 70.

When the pressing ring mechanism 10 descends under the driving of the lifting mechanism 20, the pressing ring mechanism 10 may press the second bellows 43. The second bellows 43 is pressed to move downward. The sensor 44 may be configured to detect a position of the second bellows 43 to determine the position to which the pressing ring mechanism 10 descending.

A position state of the pressing ring mechanism 10, when the pressing ring mechanism 10 first contacts the second bellows 43, may be determined in advance during descending of the pressing ring mechanism 10. Based on the position state, it is determined that how far the pressing ring mechanism 10 continues to descend to meet requirements for placing and pressing the wafer 90. The sensor 44 may feedback the detection information accordingly to determine whether the pressing ring mechanism 10 has dropped to a proper position.

In one embodiment, the position detection mechanism 40 may also include a driving part 41. The driving part 41 is configured to drive the second bellows 43 to rise and descend relative to the electrode plate 30, to adjust an initial relative position between the second bellows 43 and the pressing ring mechanism 10 to improve adaptability.

The driving part 41 may be a cylinder or other driving structure. A telescopic end of the cylinder may be connected to a mounting base 42. The second bellows 43 and the sensor 44 are both mounted on the mounting base 42.

The sensor 44 may be a photoelectric sensor or other sensing element capable of detecting a position of the second bellows 43.

The driving part 41 of the position detection mechanism 40 and the lifting driving source 21 of the lifting mechanism 20 may be installed on the support frame 60 below the partition 70.

Figure 5:
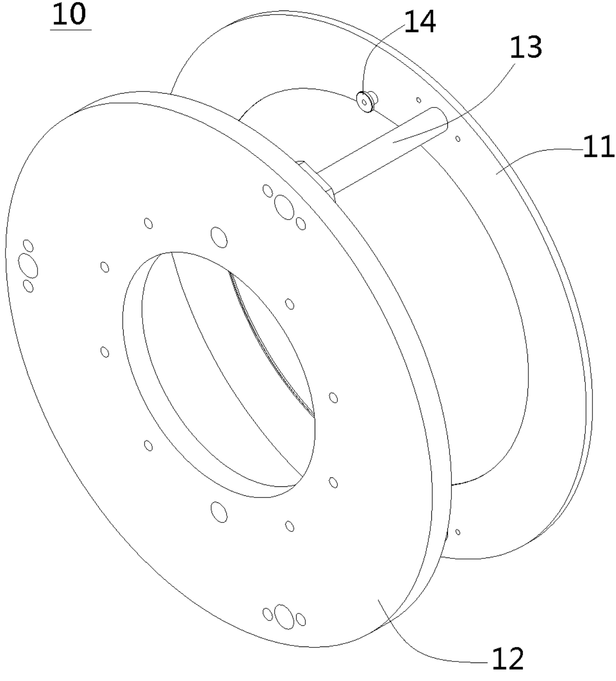
FIG. 5 is a schematic structural diagram of a pressing ring mechanism of the lower electrode structure in a specific embodiment.

Reference is made to FIG. 5, which is a schematic structural diagram of the pressing ring mechanism of the lower electrode structure in a specific embodiment.

In one embodiment, the pressing ring mechanism 10 includes a pressure ring 11, a weight plate 12 and a push rod 13. The pressure ring 11 and the weight plate 12 are connected through the push rod 13. The pressure ring 11 and the weight plate 12 can be connected by three push rods 13 to ensure the stability of the pressing ring mechanism 10. The three push rods 13 are evenly distributed in a circumferential direction of the pressure ring 11 to ensure the balance of the force during the lifting process. Apparently, in other embodiments, the number and arrangement of the push rods 13 may be set according to actual needs.

During assembly, the push rods 13 of the pressing ring mechanism 10 are configured to pass through the electrode plate 30. The pressure ring 11 of the pressing ring mechanism 10 is disposed above the electrode plate 30. The weight plate 12 is disposed below the electrode plate 30. The pressing ring 11 is provided with a supporting structure for supporting the wafer 90.

In one embodiment, the supporting structure for supporting the wafer 90 includes a support ring 14. The support ring 14 is fixed to a bottom surface of the pressure ring 11 facing the electrode plate 30. The support ring 14 has a spaced distance with the bottom surface of the electrode plate 30. The support ring 14 is provided with a supporting surface facing the pressure ring 11, that is, an upward supporting surface. The wafer 90 is supported by the supporting surface of the support ring 14, which can be understood with reference to FIG. 3.

In a case that the pressing ring mechanism 10 descends to the position where the electrode plate 30 is located, the wafer 90 may be placed on the electrode plate 30.

A groove is further provided at a position of the electrode plate 30 corresponding to the support ring 14, to avoid interference between the support ring 14 and the electrode plate 30. The support ring 14 may be embedded in the groove after being descended to ensure that the wafer 90 is placed on the electrode plate.

In actual, three support rings 14 may be evenly arranged in the circumferential direction of the pressure ring 11, to ensure the stability of supporting the wafer 90 and the reliability of driving the wafer 90 to rise and descend. Apparently, other numbers and arrangements may also be used.

The support ring 14 may be fixed to the pressure ring 11 through fasteners such as screws.

It should be understood that the pressing ring mechanism 10 may rise and descend relative to the electrode plate 30. That is, the push rods 13 of the pressing ring mechanism 10 are in sliding fit with the electrode plate 30.

In one embodiment, the lower electrode structure further includes a guide mechanism 50, to ensure the accuracy of the rising and descending of the pressing ring mechanism 10. The guide mechanism 50 is configured to guide the rising and descending of the pressing ring mechanism 10 to prevent the pressing ring mechanism 10 from shifting during the lifting process. The product reliability is improved.

Figure 6:
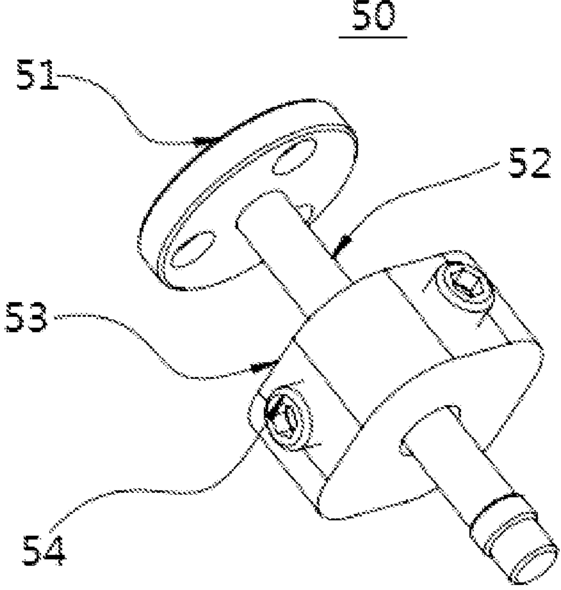
FIG. 6 is a schematic structural diagram of a guide mechanism in a specific embodiment.
Figure 7:
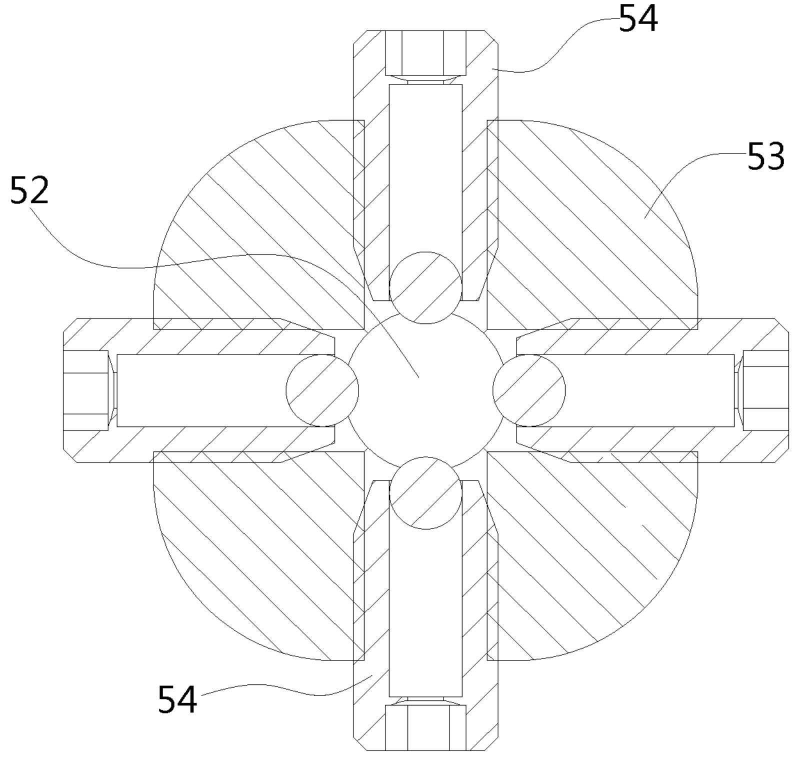
FIG. 7 is a schematic cross-sectional view of the guide mechanism at a position of the plunger base in FIG. 6.

References are made to FIGS. 6 and 7. FIG. 6 is a schematic structural diagram of the guide mechanism in a specific embodiment. FIG. 7 is a schematic cross-sectional view of the guide mechanism at the position of the plunger base in FIG. 6.

In one embodiment, the guide mechanism 50 includes a fixed base 51 and a guide shaft 52. The fixed base 51 is fixed to the bottom surface of the electrode plate 30. The guide shaft 52 is fixedly connected to the fixed base 51 and configured to pass through the weight plate 12. The axis direction of the guide shaft 52 is parallel to the lifting direction of the pressing ring mechanism 10. In this way, during the lifting process of the pressing ring mechanism 10, the weight plate 12 slides up and down along the guide shaft 52 to ensure the corresponding lifting direction of the electrode plate 30.

In one embodiment, the guide mechanism 50 further includes a plunger base 53 and a plunger 54 to further improve the reliability of the guide. The guide shaft 52 is also configured to pass through the plunger base 53. The plunger base 53 is disposed below the weight plate 12. The plunger 54 may move relative to the plunger base 53 to apply force to the guide shaft 52 in the radial direction of the guide shaft 52, to ensure that the position of the guide shaft 52 does not change.

Reference is made to FIG. 7, four plungers 54 are provided. The four plungers 54 are connected to the plunger base 53 through threads along the radial direction of the guide shaft 52. In this way, the plunger 54 may be rotated to move in the radial direction of the guide shaft 52. In practical applications, the plunger 54 may be a spherical plunger. By rotating the four plungers 54, the guide shaft 52 can be clamped to ensure its guide position.

The ion beam etching machine and the lower electrode structure therefore have been introduced in detail according to embodiments of the present disclosure. Specific embodiments are configured to illustrate principles and implementation methods of the present disclosure. The description of the above embodiments is only configured to understand the method and the core idea of the present disclosure. It should be noted that those skilled in the art can make several improvements and modifications to the present disclosure without departing from the principles of the present disclosure, and these improvements and modifications also fall within the scope of the claims of the present disclosure.

The invention claimed is:

1. A lower electrode structure of an ion beam etching machine, comprising an electrode plate, a pressing ring mechanism and a lifting mechanism, wherein the pressing ring mechanism is configured to support a to-be-etched component, the lifting mechanism is configured for driving the pressing ring mechanism to rise and descend relative to the electrode plate;

wherein the lower electrode structure further comprises:

a position detection mechanism, the position detection mechanism being configured to detect a position to which the pressing ring mechanism descends relative to the electrode plate, and the lifting mechanism being configured to stop driving the pressing ring mechanism to descend based on detection information fed back by the position detection mechanism.

2. The lower electrode structure according to claim 1, wherein the position detection mechanism comprises an elastic member and a sensor;

wherein the elastic member is capable of being compressed and deformed in a lifting direction of the pressing ring mechanism, the elastic member is disposed below the pressing ring mechanism, and the pressing ring mechanism is capable of pressing the elastic member during descending relative to the electrode plate; and wherein the sensor is configured to detect a deformation amount of the elastic member.

3. The lower electrode structure according to claim 2, wherein the position detection mechanism comprises a driving part, and the driving part is configured to drive the elastic member to rise and descend relative to the electrode plate to adjust an initial relative position between the elastic member and the electrode plate.

4. The lower electrode structure according to claim 3, wherein the driving part comprises a cylinder, the cylinder comprises a telescopic end connected to a mounting base, and the elastic member and the sensor are both mounted on the mounting base.

5. The lower electrode structure according to claim 2, wherein the elastic member is a bellows, and/or, the sensor is a fiber optic sensor.

6. The lower electrode structure according to claim 1, wherein the pressing ring mechanism comprises a pressure ring, a weight plate and a push rod;

wherein the pressure ring and the weight plate are connected by the push rod, the push rod is configured to pass through the electrode plate, the pressure ring is disposed above the electrode plate, the weight plate is disposed below the electrode plate, and the pressure ring is provided with a supporting structure for supporting the to-be-etched component.

7. The lower electrode structure according to claim 6, wherein the supporting structure comprises a support ring;

wherein the support ring is fixedly connected to a side of the pressure ring facing the electrode plate, the support ring comprises a supporting surface facing the pressure ring, and the supporting surface is configured to support the to-be-etched component.

8. The lower electrode structure according to claim 7, wherein the electrode plate is provided with a groove corresponding to the support ring, and the support ring is capable of being embedded in the groove.

9. The lower electrode structure according to claim 6, further comprising a guide mechanism;

wherein the guide mechanism is configured to guide the pressing ring mechanism to rise and descend.

10. The lower electrode structure according to claim 9, wherein the guide mechanism comprises a fixed base and a guide shaft;

wherein the guide shaft is configured to pass through the weight plate and is fixedly connected to the fixed base, the fixed base is fixedly connected to the electrode plate, and an axial direction of the guide shaft is parallel to a lifting direction of the pressing ring mechanism.

11. The lower electrode structure according to claim 10, wherein the guide mechanism further comprises a plunger base and a plunger;

wherein the guide shaft is configured to pass through the plunger base disposed below the weight plate, and the plunger is movable relative to the plunger base to apply a force to the guide shaft in a radial direction of the guide shaft.

12. An ion beam etching machine, comprising a vacuum chamber and a lower electrode structure disposed in the vacuum chamber;

wherein the lower electrode structure comprises an electrode plate, a pressing ring mechanism and a lifting mechanism;

wherein the pressing ring mechanism is configured to support a to-be-etched component, the lifting mechanism is configured for driving the pressing ring mechanism to rise and descend relative to the electrode plate;

wherein the lower electrode structure further comprises:

a position detection mechanism, the position detection mechanism being configured to detect a position to which the pressing ring mechanism descends relative to the electrode plate, and the lifting mechanism being configured to stop driving the pressing ring mechanism to descend based on detection information fed back by the position detection mechanism.

* * * * *